(12) United States Patent
Chang et al.

(10) Patent No.: US 11,877,385 B1
(45) Date of Patent: Jan. 16, 2024

(54) NOISE SUPPRESSION STRUCTURE FOR DIFFERENTIAL PAIR

(71) Applicant: FIRST HI-TEC ENTERPRISE Co., Ltd., Taoyuan (TW)

(72) Inventors: Ching-Shan Chang, Taoyuan (TW); Kun-Tao Tang, Taoyuan (TW); Tsung-Ting Tsai, Taoyuan (TW); Chien-Lin Chen, Taoyuan (TW)

(73) Assignee: FIRST HI-TEC ENTERPRISE CO., LTD., Taoyuan (TW)

( * ) Notice: Subject to any disclaimer, the term of this patent is extended or adjusted under 35 U.S.C. 154(b) by 0 days.

(21) Appl. No.: 17/864,396

(22) Filed: Jul. 14, 2022

(51) Int. Cl.
*H05K 1/02* (2006.01)
*H05K 1/11* (2006.01)

(52) U.S. Cl.
CPC ........... *H05K 1/0228* (2013.01); *H05K 1/025* (2013.01); *H05K 1/111* (2013.01); *H05K 2201/09236* (2013.01); *H05K 2201/09545* (2013.01); *H05K 2201/09718* (2013.01)

(58) Field of Classification Search
CPC .... H05K 1/0245; H05K 1/025; H05K 1/0251; H05K 1/0253; H05K 1/112–116
See application file for complete search history.

(56) References Cited

U.S. PATENT DOCUMENTS 8,715,006 B2   5/2014   Jeon

*Primary Examiner* — Jeremy C Norris
(74) *Attorney, Agent, or Firm* — HAUPTMAN HAM, LLP

(57) ABSTRACT

A circuit board comprises a substrate with opposite first and second sides. A pair of plated through holes (PTHs) extends along z-axis. A pair of signal traces are made on the first side of the substrate and electrically coupled to the pair of the PTHs respectively to form a differential pair. A ground metal is made on the second side of the substrate, the ground metal has a clearance made therein. The ground metal extends fully overlapping with the full signal traces to eliminate reflection noise caused by a boundary between the clearance and the metal ground.

9 Claims, 5 Drawing Sheets

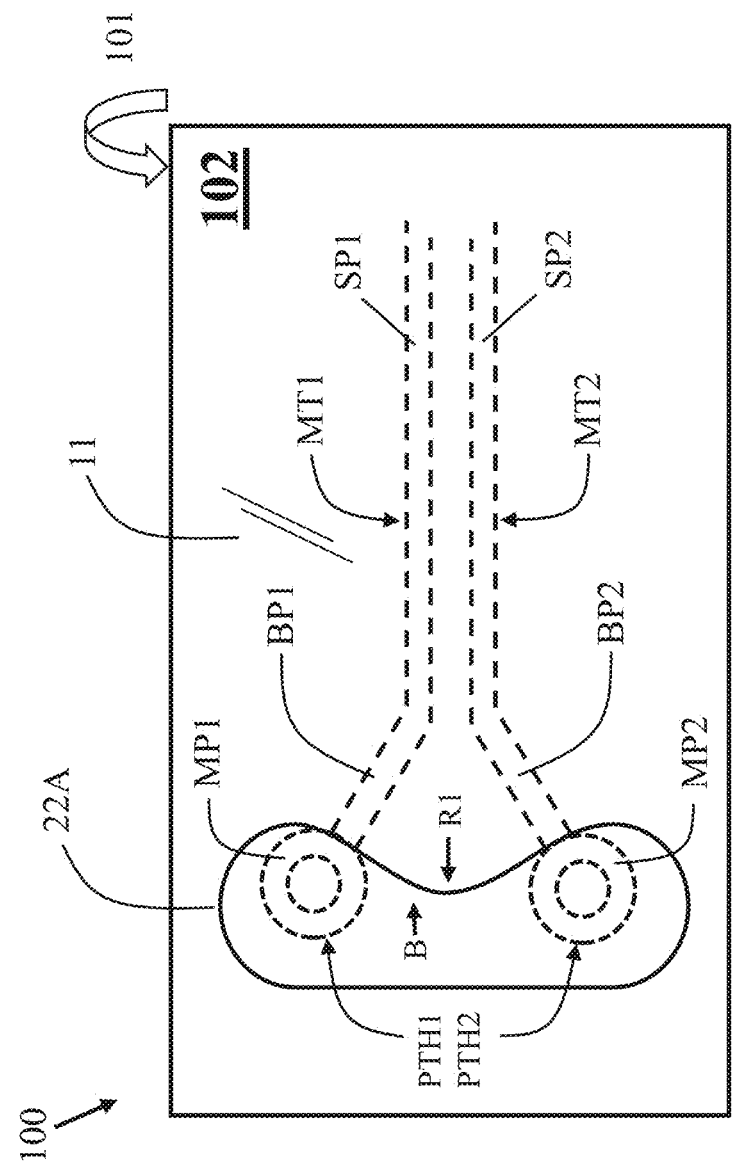

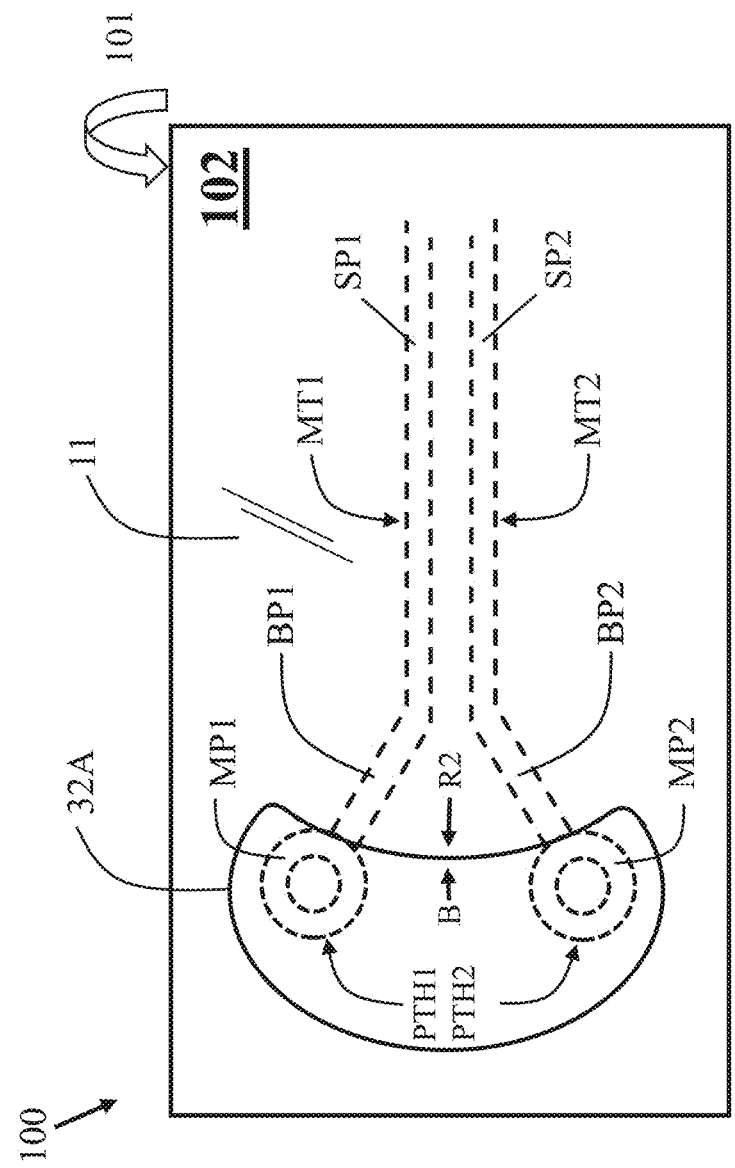

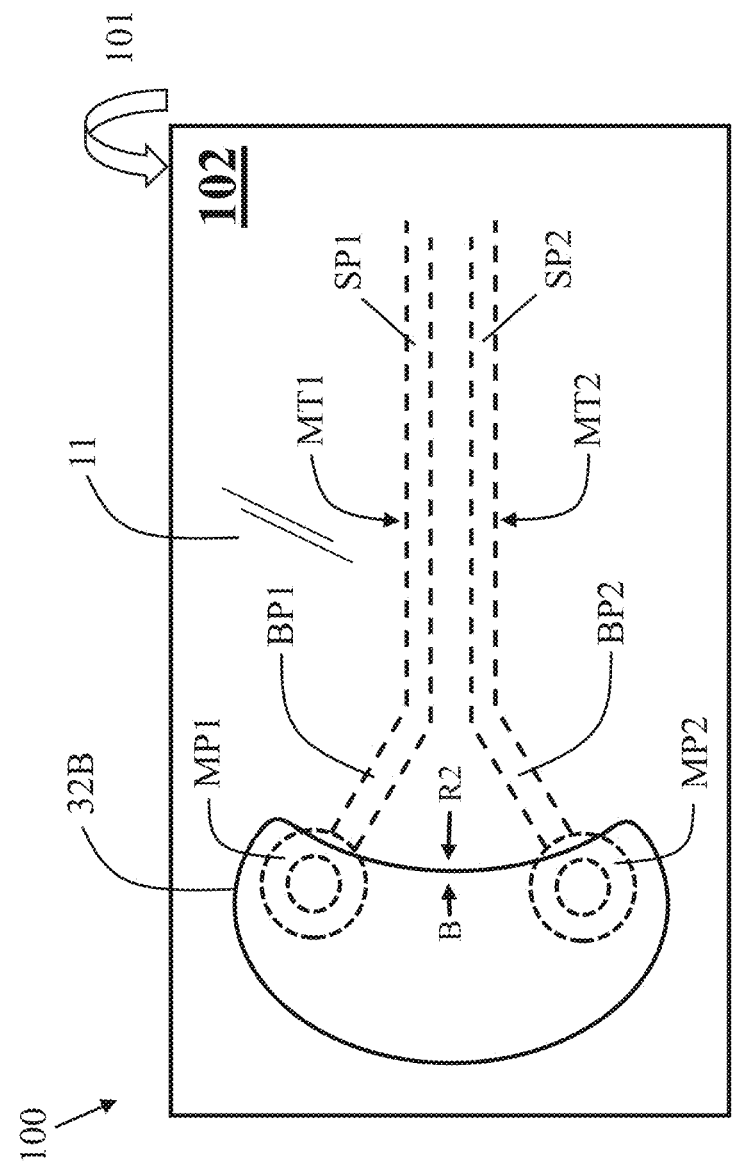

NOISE SUPPRESSION STRUCTURE FOR DIFFERENTIAL PAIR

BACKGROUND

Technical Field

The present invention relates to a noise suppression structure for differential pair, especially relates to a noise suppression structure which maintains impedance continuity along the full traces of the differential pair.

Description of Related Art

In differential signaling, each signal is transmitted using a differential pair—the signal carried by one wire is the same level as the one carried by the other wire, but in opposite polarity. The signal at the receiving end is interpreted as the difference between the two lines that make up the differential pair. If interference acts on the differential pair, it modifies both the lines similarly, but does not affect the difference between the lines. This makes differential signaling immune to electrical interference.

FIG. 1A~1C shows a prior art.

FIG. 1A~1C shows a prior art—U.S. Pat. No. 8,715,006 which discloses a circuit board with a plurality of differential pairs.

FIG. 1A shows a plane view of a first side 101 of a substrate 100 disclosed in the prior art. A differential pair DP is formed on the first side 101 of the substrate 100. The differential pair DP comprises a first plated through hole PTH1, a second plated through hole PTH2, a first metal trace MT1, and a second metal trace MT2.

FIG. 1B shows a plane view of the second side 102 of the substrate 100. A metal ground 11 is formed on a second side 102 of the substrate 100. A clearance 12 is formed on a left side of the metal ground 11.

FIG. 1C shows a projection view from the second side 102 of the substrate 100. The clearance 12 has an area which is configured to overlap with full PTH1, PTH2, and partial of the traces MT1, MT2 of the differential pair DP in a projection view.

Reflection noise results when an electromagnetic wave encounters a boundary from one medium to the next. When the wave meets the boundary, part of the energy is transmitted as signal and part of it is reflected. For electrical engineers, the medium where this boundary occurs is usually described in terms of its electrical impedance; that is, the boundary is where impedance changes. Whenever the impedance changes in a circuit, and therefore reflection noise occurs.

Since partial of the traces MT1, MT2 in the prior art overlaps with the clearance 12 while partial of the traces MT1, MT2 overlaps with the ground metal 11, a boundary B between the clearance 12 and the metal ground 11 is created and hence a reflection noise occurs therefrom.

BRIEF DESCRIPTION OF THE DRAWINGS

FIG. 2 shows a first embodiment according to the present invention.
FIG. 4 shows a third embodiment according to the present invention.
FIG. 5 shows a fourth embodiment according to the present invention.

DETAILED DESCRIPTION OF THE INVENTION

Figure 1B:
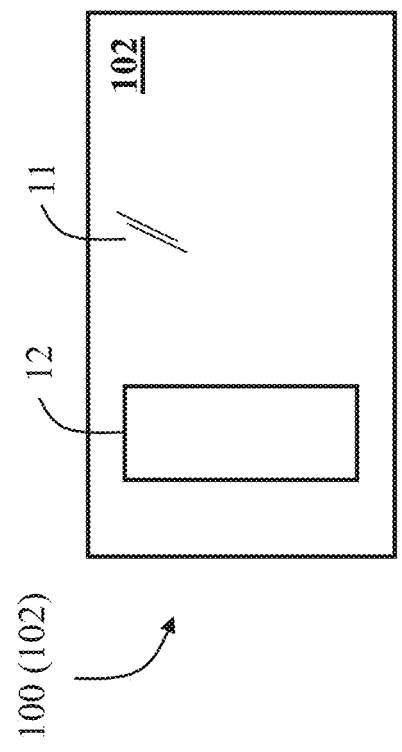
FIG. 1A-1C shows a prior art.
Figure 1A:
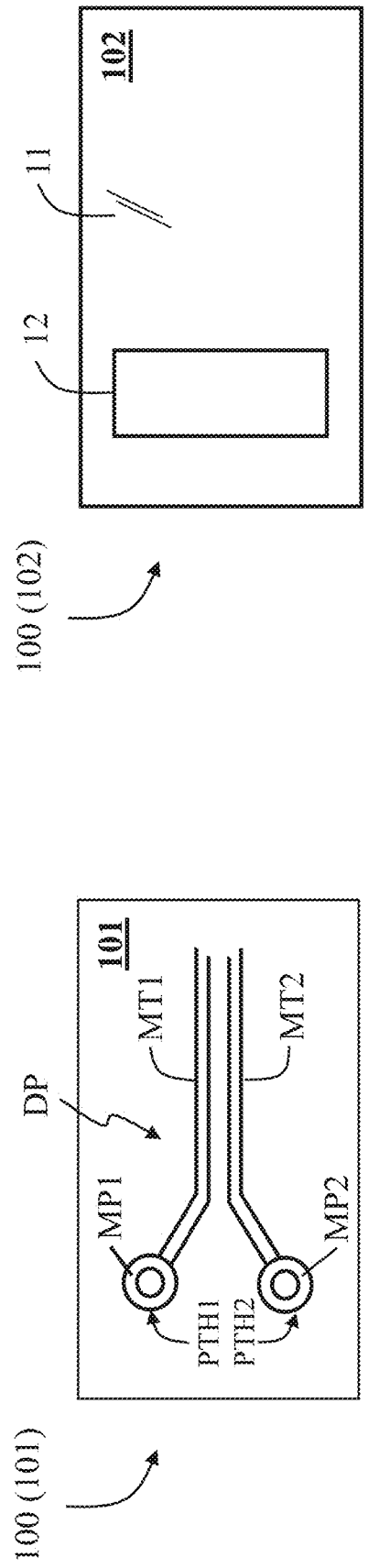
Figure 1C:
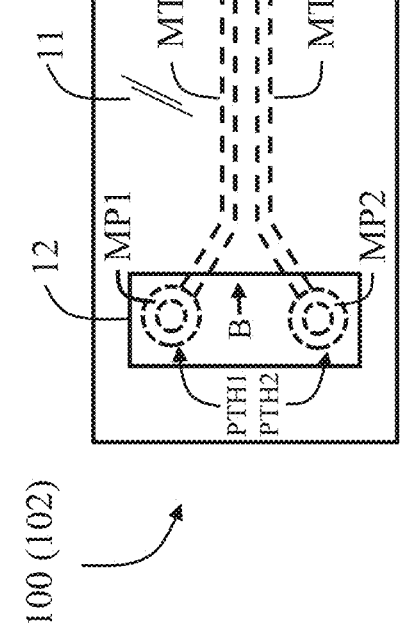

The present invention firstly conceives to eliminate the reflection noise by extending the metal ground to fully overlapping with the traces of the differential pair DP in a projection view so that the continuity of the characteristic impedance of the metal trace is maintained along the full metal traces before them connects to corresponding metal pads of the plated through holes (PTHs), and therefore reflection noise is eliminated from the metal traces MT1, MT2.

FIG. 2 shows a first embodiment according to the present invention.

FIG. 2 shows that a circuit board comprises at least a substrate 100, the substrate 100 has a first side 101 and a second side 102 opposite to the first side 101. A first plated through hole PTH1 and a second plated through hole PTH2 are formed therein. FIG. 2 is a projection view or perspective view from the second side 102 to the first side 101 of the substrate 100.

On the first side 101 of the substrate 100, a plurality of metal traces including a first metal trace MT1 and a second metal trace MT2 are formed thereon. A first metal pad MP1 surrounds the first PTH, a second metal pad MP2 surrounds the second PTH; the first metal trace MT1 has a first straight portion SP1 and a first bridging portion BP1, a second metal trace MT2 has a second straight portion SP2 and a second bridging portion BP2, wherein the first straight portion SP1 is paralleled with the second straight portion SP2, the first bridging portion BP1 electrically couples the first straight portion SP1 to the first metal pad MP1, and the second bridging portion BP2 electrically couples the second straight portion SP2 to the second metal pad MP2.

On the second side 102 of the substrate 100, a ground plane 11 is formed thereon. The ground plane 102 comprises a ground metal 11 (e.g., copper) and is configured to provide an electrical ground for the circuit board 100. A clearance 22A is made within the ground metal 11, the clearance 22A has an area fully or nearly fully overlapping with the first metal pad MP1 and the second metal pad MP2 in a projection view; the metal ground 11 has a metal area fully overlapping with the first bridging portion BP1 and the second bridging portion BP2 in a projection view.

Since the clearance 22A is configured without overlapping with the metal traces MT1, MT2, while the ground metal 11 is configured fully overlapping with the metal traces MT1, MT2, and hence the characteristic impedance for the metal traces MT1, MT2 are maintained the same along the full traces MT1, MT2.

The clearance 22A is shaped like a capsule with a recess R1 configured between the first metal pad MP1 and the second metal pad MP2. The clearance 22A has an area being configured without overlapping with the first bridging portion BP1 and the second bridging portion BP2.

Figure 3:
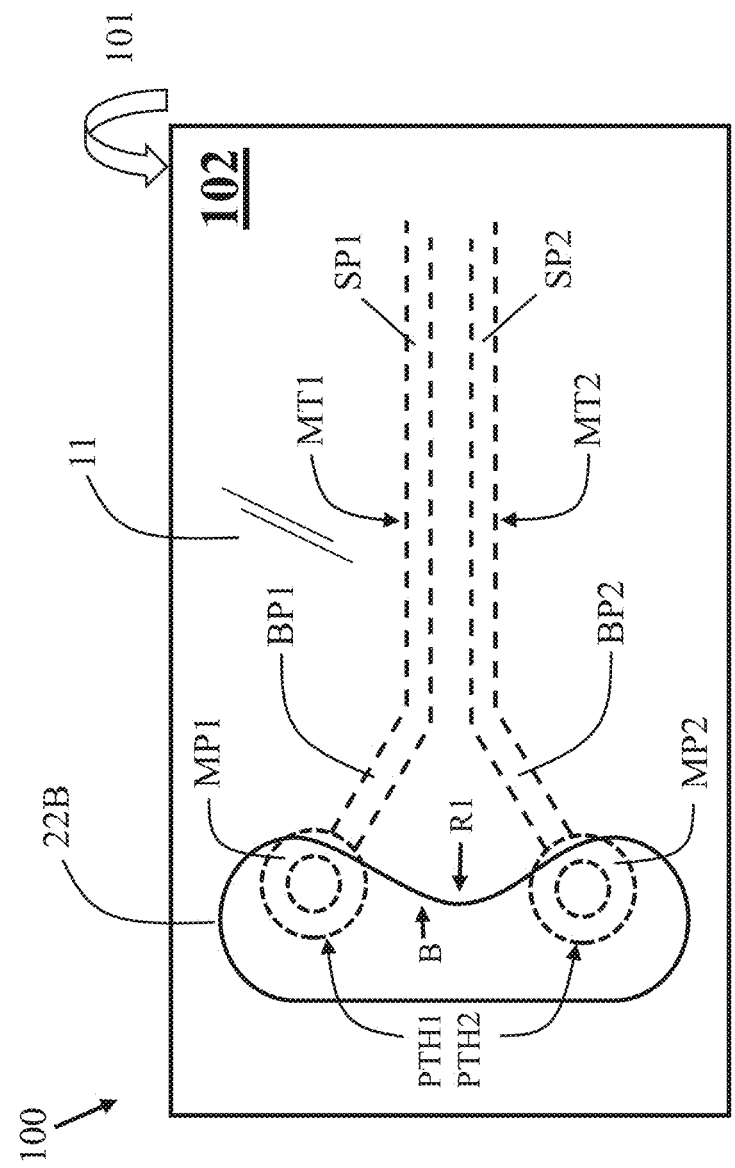
FIG. 3 shows a second embodiment according to the present invention.

FIG. 3 shows a second embodiment according to the present invention.

FIG. 3 shows a modified embodiment with reference to FIG. 2, the clearance 22B in FIG. 3 is moved left to assure that the ground metal 11 fully overlaps with the full metal traces MT1, MT2. The clearance 22B is shaped like a capsule with a recess R1 between the first metal pad MP1 and the second metal pad MP2. The clearance 22B has an area being configured without overlapping with the first bridging portion BP1 and the second bridging portion BP2.

FIG. 4 shows a third embodiment according to the present invention.

FIG. 4 shows a noise suppression structure similar to that of FIG. 2, the only difference is the shape of clearance 32A. The clearance 32A in FIG. 4 is shaped like a kidney or a moon block with a recess R2 configured between the first metal pad MP1 and the second metal pad MP2. The clearance 32A is shaped like a kidney or a moon block with a recess R2 between the first metal pad MP1 and the second metal pad MP2.

The clearance 32A has an area being configured without overlapping with the first bridging portion BP1 and the second bridging portion BP2.

FIG. 5 shows a fourth embodiment according to the present invention.

FIG. 5 shows a noise suppression structure similar to that of FIG. 3, the only difference is the shape of clearance 32B. The clearance 32B in FIG. 5 is shaped like a kidney or a moon block with a recess R2 configured between the first metal pad MP and the second metal pad MP2.

The clearance 32B has an area being configured without overlapping with the first bridging portion BP1 and the second bridging portion BP2.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A noise suppression structure for differential pair, comprises:
   a substrate having
   a first side and a second side opposite to the first side;
   a first plated through hole (PTH), and
   a second plated through hole (PTH);
   on the first side of the substrate, there being
   a first metal pad surrounding the first PTH,
   a second metal pad surrounding the second PTH;
   a first metal trace having a first straight portion and a first bridging portion,
   a second metal trace having a second straight portion and a second bridging portion, wherein
   the first straight portion being paralleled with the second straight portion,
   the first bridging portion electrically coupling the first straight portion to the first metal pad, and
   the second bridging portion electrically coupling the second straight portion to the second metal pad;
   on the second side of the substrate, there being
   a metal ground having a clearance, the clearance being configured overlapping with at least partial of the first metal pad and the second metal pad, wherein
   the metal ground has a metal area fully overlapping with the first bridging portion and the second bridging portion in a projection view.

2. The noise suppression structure as claimed in claim 1, wherein the clearance has an area fully overlapping with the first metal pad and the second metal pad in a projection view.

3. The noise suppression structure as claimed in claim 2, wherein the clearance has an area being configured without overlapping with the first bridging portion and the second bridging portion.

4. The noise suppression structure as claimed in claim 3, wherein the clearance is shaped like a capsule with a recess configured between the first metal pad and the second metal pad.

5. The noise suppression structure as claimed in claim 3, wherein the clearance is shaped like a kidney or a moon block with a recess configured between the first metal pad and the second metal pad.

6. The noise suppression structure as claimed in claim 1, wherein the clearance has an area nearly fully overlapping with the first metal pad and the second metal pad in a projection view.

7. The noise suppression structure as claimed in claim 6, wherein the clearance has an area being configured without overlapping with the first bridging portion and the second bridging portion.

8. The noise suppression structure as claimed in claim 7, wherein the clearance is shaped like a capsule with a recess configured between the first metal pad and the second metal pad.

9. The noise suppression structure as claimed in claim 7, wherein the clearance is shaped like a kidney or a moon block with a recess configured between the first metal pad and the second metal pad.

* * * * *